US 6,589,861 B2

(12) United States Patent
Park et al.

(10) Patent No.: US 6,589,861 B2
(45) Date of Patent: Jul. 8, 2003

(54) METHOD FOR FABRICATING A SEMICONDUCTOR DEVICE

(75) Inventors: Chang Heon Park, Seoul (KR); Yun Seok Cho, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/015,672

(22) Filed: Dec. 17, 2001

(65) Prior Publication Data

US 2002/0081835 A1 Jun. 27, 2002

(30) Foreign Application Priority Data

Dec. 23, 2000 (KR) .......................... 2000-81182

(51) Int. Cl.[7] ...................... H01L 21/4763; H01L 21/76
(52) U.S. Cl. ...................... 438/619; 438/411; 438/421; 438/422
(58) Field of Search ................. 438/619, 421, 438/422, 411

(56) References Cited

U.S. PATENT DOCUMENTS 4,473,437 A * 9/1984 Higashikawa et al.
6,090,698 A * 7/2000 Lee
6,448,177 B1 * 9/2002 Morrow et al.

* cited by examiner

*Primary Examiner*—Ha Tran Nguyen
(74) *Attorney, Agent, or Firm*—Morgan, Lewis & Bockius LLP

(57) ABSTRACT

A method for fabricating a semiconductor device includes sequentially forming a stopping layer, an intermetal dielectric, and a capping layer on an interlayer dielectric, selectively removing the capping layer, the intermetal dielectric, and the stopping layer to partially expose a surface of the interlayer dielectric to form a hole, selectively removing a side of the intermetal dielectric within the hole, depositing a metal film on an entire surface including the hole to form an air gap in a portion where the side of the intermetal dielectric is removed, and planarizing an entire surface of the metal film to expose a surface of the capping layer to form a plurality of metal lines.

12 Claims, 2 Drawing Sheets

METHOD FOR FABRICATING A SEMICONDUCTOR DEVICE

This application claims the benefit of the Korean Application No. P2000-81182 filed on Dec. 23, 2000, which is hereby incorporated by reference.

BACKGROUND OF THE INVENTION

1. Field of the Invention

The present invention relates to a method for fabricating a semiconductor device, and more particularly, to a method for fabricating a semiconductor device in which capacitance between lines is reduced in a multi-layered line to improve reliability of the device.

2. Discussion of the Related Art

Recently, with high packing density of a semiconductor device, a device structure having a multi-layered line has been required. The distance between metal lines on the same layer has been gradually narrowed.

Parasitic resistance and parasitic capacitance existing between adjacent metal lines on the same layer or between adjacent metal lines in vertical direction have been highlighted.

Meanwhile, in fabricating a semiconductor device having ultra-high packing density, performance of a chip is limited by capacitance between lines as dimensions of the chip gradually become smaller.

In other words, capacitance between lines causes RC delay in fabricating a device, thereby degrading electrical characteristic of the device. Also, the capacitance between lines increases RC power consumption, and causes crosstalk, thereby increasing signal leakage.

Accordingly, to reduce capacitance between lines in a semiconductor device having ultra-high packing density, a metal line is formed using metal having low specific resistance or an insulating film having low dielectric constant is used.

Recently, an air gap is artificially formed between metal lines when an insulating interlayer is formed using step coverage of the metal line. Since the air gap has a dielectric constant of 1, a capacitance value can be reduced.

A related art method for fabricating a semiconductor device will be described with reference to FIGS. 1A to C.

FIGS. 1A to C are sectional views illustrating a related art method for fabricating a semiconductor device.

As shown in FIG. 1A, a conductive metal film is deposited on an interlayer dielectric 101 and selectively patterned by photolithography and etching processes, so that metal lines 102 are formed at a constant interval.

Oxide is used as a material of the interlayer dielectric 101.

As shown in FIG. 1B, oxide having low dielectric constant Low-K is deposited on an entire surface including the metal lines 102 by a plasma enhanced chemical vapor deposition (PECVD) method of poor step coverage, so that an intermetal dielectric 103 is formed.

When the intermetal dielectric 103 is formed, since the PECVD method of poor step coverage is used, an air gap 104 is formed between the metal lines 102 to reduce the capacitance.

As shown in FIG. 1C, a surface of the intermetal dielectric 103 is planarized by a chemical mechanical polishing (CMP) process. At this time, the air gap 104 formed in the intermetal dielectric 103 is exposed.

However, the related art method for fabricating a semiconductor device has several problems.

Since the air gap between the metal lines is exposed during the CMP process, short may be caused in a later process and capacitance between the lines cannot be reduced, thereby reducing reliability of the device.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a semiconductor device in which an air gap is stably formed to reduce capacitance between lines, thereby improving reliability of the device.

Additional features and advantages of the invention will be set forth in the description which follows, and in part will become apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device includes sequentially forming a stopping layer, an intermetal dielectric, and a capping layer on an interlayer dielectric, selectively removing the capping layer, the intermetal dielectric, and the stopping layer to partially expose a surface of the interlayer dielectric to form a hole, selectively removing a side of the intermetal dielectric within the hole, depositing a metal film on an entire surface including the hole to form an air gap in a portion where the side of the intermetal dielectric is removed, and planarizing an entire surface of the metal film to expose a surface of the capping layer to form a plurality of metal lines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2D are cross sectional views illustrating an exemplary method for fabricating a semiconductor device according to the present invention.

Figure 1A:
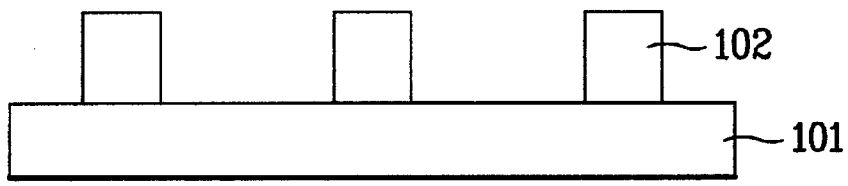
FIGS. 1A to 1C are cross sectional views illustrating a method for fabricating a semiconductor device according to the related art.
Figure 1B:
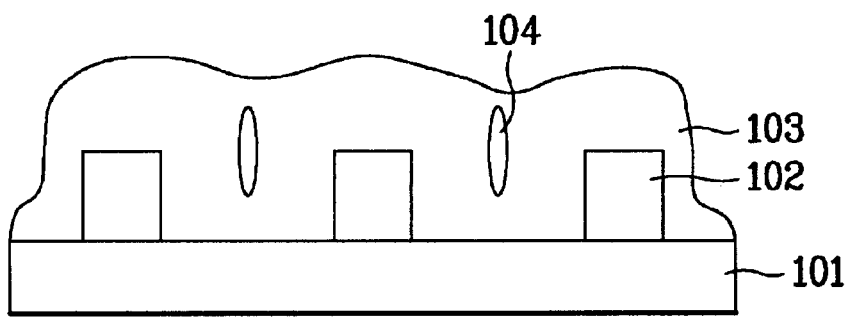
Figure 1C:
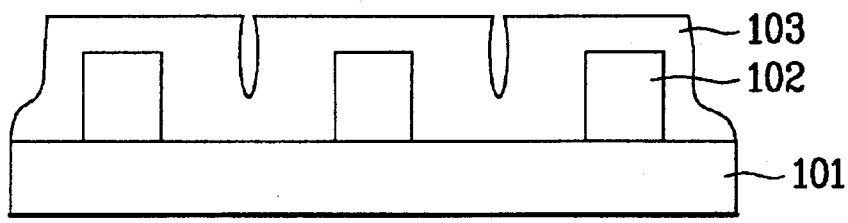
Figure 2A:
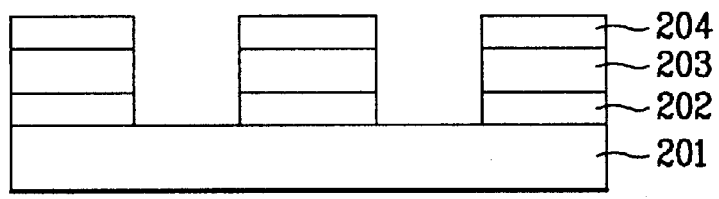
FIGS. 2A to 2D are cross sectional views illustrating an exemplary method for fabricating a semiconductor device according to the present invention.

In FIG. 2A a stopping layer 202, an intermetal dielectric 203, and a capping layer 204 may be sequentially formed on an interlayer dielectric 201. Nitride or oxide, for example, may be used as a material of the stopping layer 202. Oxide having low dielectric constant, for example, may be mainly used as the intermetal dielectric 203. Nitride or oxide, for example, may be used as the capping layer 204.

Meanwhile, in case where oxide is used as the intermetal dielectric 203, nitride may be used as the stopping layer 202 and the capping layer 204, so that difference between the intermetal dielectric 203 and the stopping layer 202 or the capping layer 204 in etch selectivity occurs.

Subsequently, the capping layer 204, the intermetal dielectric 203, and the stopping layer 202 may be selectively removed to partially expose a surface of the interlayer dielectric 201, so that a hole is formed.

Figure 2B:
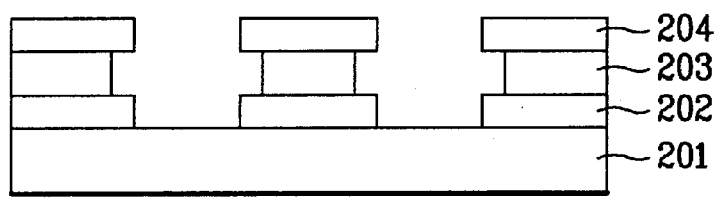

In FIG. 2B, a side of the intermetal dielectric 203 may be selectively etched using etch selectivity of the stopping layer 202, the intermetal dielectric 203, and the capping layer 204.

At this time, the etch selectivity between the intermetal dielectric 203 and the stopping layer 203 and between the intermetal dielectric 203 and the capping layer 204 should be 2:1. The intermetal dielectric 203 may be etched by a dry etching process or a wet etching process, for example.

Meanwhile, ACT®-935 by Ashland® chemical, tetramethoxy-ammonium hydroxide (TMAH), buffered oxide etch (BOE), or HF may be used as an etching solution during the wet etching process. The ACT®-935 is a washing solution for plasma etching and is of $H_2O$, ethanolamine, and hydroxylamine.

Etch conditions of an etch chamber during the dry etching may be as follows: RC power of about 200W, about 50 m Torr, and an etch gas of CO, $CO_2$, $SO_X$, and $NH_3$.

Figure 2C:
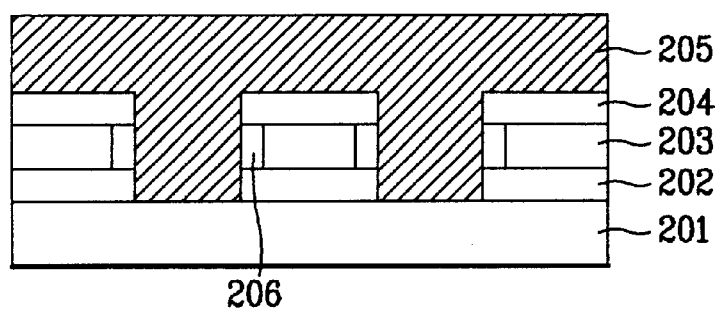

As shown in FIG. 2C, a metal film 205 for metal lines may be deposited on the entire surface including the hole.

At least one of Al, W, TiN, Ti, TiAlN, TiSiN, TiW, and TaN, for example, may be used as the metal film 205.

When the metal film 205 is deposited, an air gap 206 may be formed between the stopping layer 202 and the capping layer 204, i.e., a portion where the side of the intermetal dielectric 203 is etched.

Figure 2D:
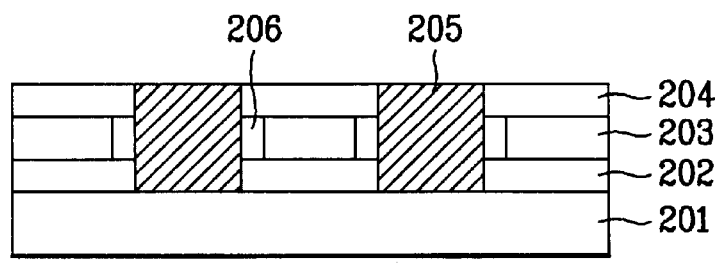

As shown in FIG. 2D, the metal film 205 may be planarized by a CMP process, for example, to expose an upper surface of the capping layer 204, so that metal lines are formed.

As aforementioned, the method for fabricating a semiconductor device according to the present invention has the following advantages. Since the air gap is formed by etching the side of the intermetal dielectric using the etch selectivity of the capping layer and the stopping layer, the capacitance between the lines can be reduced. Furthermore, since the air gap is effectively formed and controlled and is prevented from being exposed during the CMP process, reliability of the device can be improved. Moreover, the capacitance between the lines can effectively be reduced.

It will be apparent to those skilled in the art than various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

sequentially forming a stopping layer, an intermetal dielectric, and a capping layer on an interlayer dielectric;

selectively removing the capping layer, the intermetal dielectric, and the stopping layer to partially expose a surface of the interlayer dielectric to form a hole;

selectively removing a side of the intermetal dielectric within the hole;

depositing a metal film on an entire surface including the hole to form an air gap in a portion where the side of the intermetal dielectric is removed; and planarizing an entire surface of the metal film to expose a surface of the capping layer to form a metal line, wherein the air gap is bound by the capping layer, the stopping layer, and the metal film.

2. The method according to claim 1, wherein the stopping layer and the capping layer have a same etch selectivity.

3. The method according to claim 1, wherein the stopping layer and the capping layer are formed of a material including at least one of nitride and oxide.

4. The method according to claim 1, wherein the intermetal dielectric is formed of a material having an etch selectivity different from an etch selectivity of one of the stopping layer and the capping layer.

5. The method according to claim 1, wherein the intermetal dielectric includes at least an oxide.

6. The method according to claim 1, wherein the intermetal dielectric has an etch selectivity of 2:1 with one of the stopping layer and the capping layer.

7. The method according to claim 1, wherein the metal film includes at least one of Al, W, TiN, Ti, TiAlN, TiSiN, TiW, and TaN.

8. The method according to claim 1, wherein the metal film is planarized by a CMP process.

9. The method according to claim 1, wherein the side of the intermetal dielectric is removed by one of a dry etching process and a wet etching process.

10. The method according to claim 9, wherein the wet etching process is performed using at least one etching solution of ACT®-935, TMAH, BOE, and HF.

11. The method according to claim 9, wherein the dry etching process is performed under conditions of an etch chamber having an RC power of about 200 W and a pressure of about 50 mTorr.

12. The method according to claim 9, wherein the dry etching process is performed using an etch gas of CO, $CO_2$, $SO_X$, and $NH_3$.

* * * * *